United States Patent
Broer et al.

(10) Patent No.: US 7,578,949 B2
(45) Date of Patent: Aug. 25, 2009

(54) FLEXIBLE FOIL MOVEABLE BY NON-MECHANICAL MEANS

(75) Inventors: Dirk Jan Broer, Eindhoven (NL); Christiane Maria Rosette De Witz, Eindhoven (NL); Grietje Neeltje Mol, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 498 days.

(21) Appl. No.: 10/597,580

(22) PCT Filed: Jan. 26, 2005

(86) PCT No.: PCT/IB2005/050313

§ 371 (c)(1),
(2), (4) Date: Jul. 31, 2006

(87) PCT Pub. No.: WO2005/075605

PCT Pub. Date: Aug. 18, 2005

(65) Prior Publication Data

US 2008/0264058 A1    Oct. 30, 2008

(30) Foreign Application Priority Data

Feb. 4, 2004    (EP)    .................................. 04100405

(51) Int. Cl.
*C09K 19/38* (2006.01)
*C09K 19/60* (2006.01)
*B81B 3/00* (2006.01)
*F03G 7/06* (2006.01)

(52) U.S. Cl. ............................... 252/299.01; 252/299.1

(58) Field of Classification Search ............ 252/299.01, 252/299.1; 349/1

See application file for complete search history.

(56) References Cited

U.S. PATENT DOCUMENTS

| 6,137,623 | A | * | 10/2000 | Roberson et al. | ............ 359/291 |
| 2008/0258108 | A1 | * | 10/2008 | Broer et al. | ............ 252/299.68 |
| 2008/0259226 | A1 | * | 10/2008 | Broer et al. | .................... 349/1 |

* cited by examiner

*Primary Examiner*—Shean C Wu (57) ABSTRACT

A foil moveable by non-mechanical means, such as light or heat, comprises an alternating array of first and second foil sections each resiliently and non-mechanically moveable between a flattened state and a bent state. The direction in which the first foil sections bend, when moved from the flattened to the bent state, is opposite to the direction in which the second foil sections bend when moved from the flattened to the bent state. When, in the flattened state, non-mechanically stimulating the first and second foil sections in unison, the first and second foil sections bend in opposite directions causing the foil to wrinkle, which results in a movement which is substantially linear. Using a different or removing the non-mechanical stimulus, the foil sections can be made to unbend resulting in a flattening and expansion of the foil to its original shape.

9 Claims, 3 Drawing Sheets

FLEXIBLE FOIL MOVEABLE BY NON-MECHANICAL MEANS

The invention relates to a flexible foil which is moveable by non-mechanical means.

A flexible foil as mentioned in the opening paragraph is known in the art as such. A bimorphic metal foil which bends when heated is a well-known example. A polymeric variant of such a foil is disclosed in U.S. Pat. No. 6,137,623.

Bending and unbending are movements which have a relatively large rotational component in respect of the relative displacement between edge locations of a foil positioned on either side of the bend. For many applications, having such a large rotational component is suitable but other applications may benefit from a foil movement which is more linear. Thus, there is a need for a foil which is moveable by non-mechanical means wherein the movement is more linear than provided by a bending movement.

It is an object of the invention, inter alia, to provide a flexible foil which is moveable by non-mechanical means with relatively large amplitude and wherein the displacement of edge portions of the foil relative to another provided by the movement is more linear than provided by a bending movement.

These and other objects are achieved by a flexible foil, moveable by non-mechanical means, comprising an alternating array of first and second foil sections each non-mechanically moveable between a flattened state and a bent state having a predetermined direction of bending, wherein the predetermined direction of bending of first foil sections is opposite to the predetermined direction of bending of second foil sections.

The foil in accordance with the invention is moveable between a contracted and an expanded state by non-mechanical means. Depending of the particular embodiment, it may be moveable from a contracted to an expanded state, from an expanded to a contracted state, or reversibly between an expanded and a contracted state. In the expanded state the first and second foil sections are each in the flattened state and in the contracted state the first and second foil sections are each in the bent state. Subjecting the first and second foil sections of the foil to the non-mechanical means simultaneously, causes the first and second foil sections to bend (or unbend) in unison. Because the first and second foil sections bend in opposite directions and are arranged alternately in an array, the concerted bending movement of the foils sections causes the foil to wrinkle and contract. The contraction and expansion results in a relative displacement of end portions of the foil which is more linear than the displacement associated with a bending and unbending movement.

Because the linear movement is realized by wrinkling (unwrinkling) of the foil, the magnitude of the linear movement can be quite large, quite large meaning significantly larger than typical thermal expansion effects; typically, expansion due to thermal effects is less than about 5%.

The movement may be reversible. By application of a different or a removal of the non-mechanical stimulus the first and second foils sections flatten causing the foil to flatten and expand.

In a particular embodiment, at least one of the first and second foil sections includes a polymeric material.

Polymeric materials have excellent resilient properties allowing movement of large magnitude and are, compared to inorganic foils, facile and cost-effective to manufacture and process.

More particularly, the polymeric material includes a polymerized liquid crystal.

Making use of polymerized liquid crystal allows the array of first and second foil sections to be formed simultaneously in situ thus significantly facilitating manufacture of the foil in accordance with the invention. Furthermore, an anisotropically oriented polymerized liquid crystal has directionally dependent properties allowing more precise over the movement of the foil sections. Moreover in selected directions the bending may involve contraction of the polymerized liquid crystal enabling particularly large bending effects.

An attractive embodiment is one wherein at least one of the first and second foil sections includes a polymerized liquid crystal which, near one major surface of the foil, is anisotropically oriented and exhibits, in directions transverse to the foil, a change in orientation and/or concentration.

More in particular, the polymerized liquid crystal has a splay orientation with a planar orientation near the one major surface of the foil and a homeotropic orientation near the major surface opposite the one major surface.

A splay orientation allows large magnitude bending in a controlled manner.

A further embodiment of the foil in accordance with the invention is one wherein the first and second foil sections are non-mechanically moveable between a flattened state and a bent state by means of radiation.

Radiation is an attractive non-mechanical means. It provides for foils which are stable in the contracted and expanded state thus eliminating a need to keep applying the non-mechanical means when in such stable state. It also allows the non-mechanical means to be applied locally.

Another embodiment is one wherein the first and second foil sections are non-mechanically moveable between a flattened state and a bent state by means of supplying or extracting heat.

Extraction or supply of heat is attractive because it may be used for a wide variety of materials. Substantially all materials have a temperature dependent and thus heat-sensitive expansion, although the magnitude of the expansion may vary substantially from one material to another.

Different mechanical means may be used to enable contraction and expansion. For example, contraction may be effected using light whereas expansion is effected by means of supplying or extracting heat.

An attractive embodiment is one wherein the foil is attached to a structure which is fixed relative to the movement of the foil.

To be able to function as, for example, an actuator the foil needs to be attached to a fixed structure.

A further embodiment is one wherein the foil is a valve switchable between a closed and an open state. The valve may be used as a moveable barrier to contain, keep out or separate matter, such as gas or fluid, or radiation such as light. These and other aspects of the invention will be apparent from and elucidated with reference to the drawings and the embodiments described hereinafter.

Figure 1:
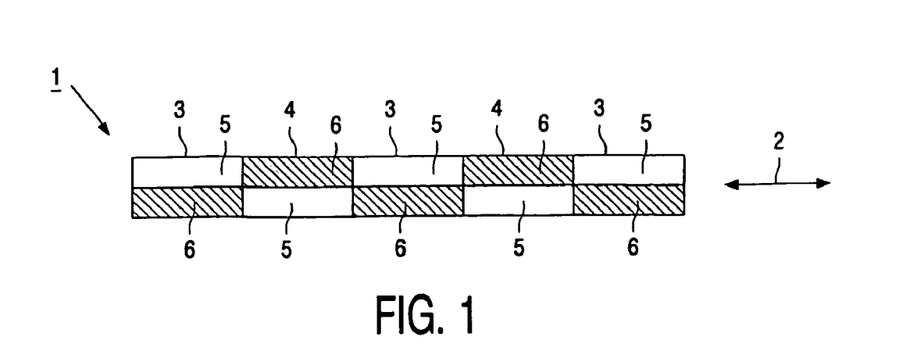
FIG. 1 shows, schematically, a cross-sectional view of a first embodiment of a foil in accordance with the invention.

FIG. 1 shows, schematically, a cross-sectional view of a first embodiment of a flexible foil in accordance with the invention. The flexible foil 1 is moveable by non-mechanical means with large magnitude, the movement of the foil 1 having a large linear component in the direction indicated by the arrow 2. To enable such movement, the foil 1 comprises first foil sections 3 and second foil sections 4. Each of the foil sections 3 and 4 is a bi-layer (needless to say, a stack comprising any number of layers of more than two can also be used) arrangement which is moveable by nor-mechanical means between a flattened and a bent state. In the embodiment shown in FIG. 1, each foil section 3 and 4 comprises a flexible layer 5 and a flexible layer 6. The flexible layers 5 and 6 are mutually adapted such that, when subjected to non-mechanical means, layer 6 expands less than layer 5 in the direction 2. In the context of the invention, the term "expanding less" encompasses contraction. If such a foil section is stimulated non-mechanically the difference in expansion transverse to the foil causes the foil section to bend. The direction of bending of a foil section is always such that the layer having the lesser expansion, here layer 6, is located on the inside of the bend. The foil sections are moveable between a flattened state and a bent state, where flattened means having less curvature than the bent state, the direction of bending of a foil section being predetermined.

Figure 2:
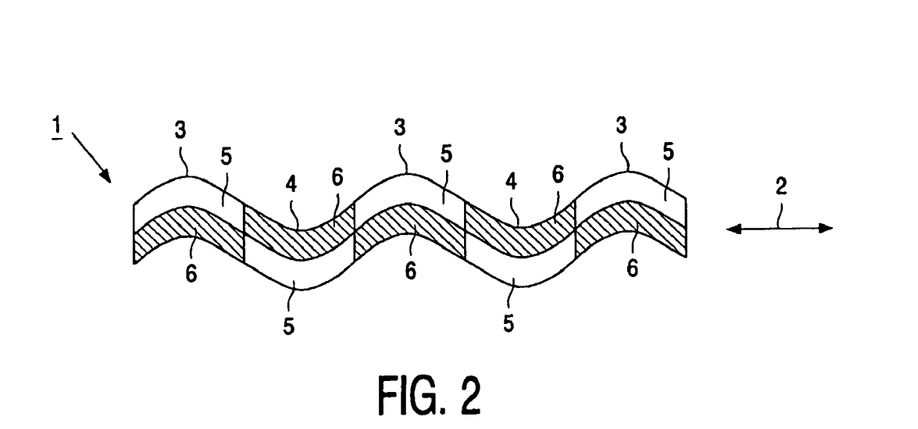
FIG. 2 shows, schematically, a cross-sectional view of a foil in accordance with the invention in a contracted state.

The layers 5 and 6 of the second foil sections 4 are stacked in reverse order to the layers 5 and 6 of the first foil sections 3. Accordingly, the foil sections 3 and 4 bend in opposite directions. Because, in addition, the foils sections 3 and 4 are laid out in an array in an alternating manner, bending occurs alternately in opposite directions causing the foil 1 to wrinkle and contract as shown in FIG. 2. If the foils sections 3 and 4, but for the direction of bending, are identical, the wrinkling proceeds in a perfectly regular manner resulting in a perfectly linear displacement in the direction 2. However, in practice it is difficult to realize such perfection. Accordingly, in practice the movement is not perfectly linear but will have a (small) rotational component. However, the rotational component is smaller than would result from a foil wherein the all first and second foil sections would bend in the same direction.

The foil 1 may be manufactured by assembling discrete foils sections on a thin flexible supporting substrate. The substrate may also be sandwiched between the two layers of the bi-layer structure. The bi-layer or multi-layer foil having first and second foil sections may be manufactured by assembling separate self-supporting flexible layers each serving as a layer 5 or 6 into a composite foil. A supporting film (not shown in FIG. 1) may facilitate assembly. Such a supporting film may be laminated onto the foil sections 3 and 4 or arranged between the layers 5 and 6 thus forming a tri-layer stack. The foil sections may be formed abutting or spaced.

Figure 3:
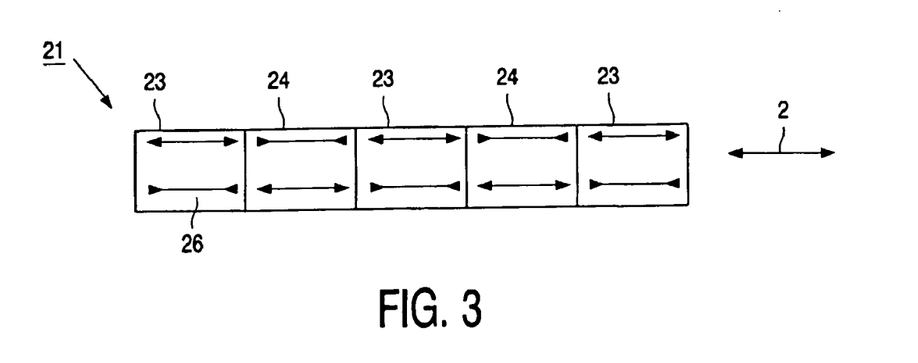
FIG. 3 shows, schematically, a cross-sectional view of a second embodiment of a foil in accordance with the invention.

FIG. 3 shows, schematically, a cross-sectional view of a second embodiment of a foil in accordance with the invention. The foil 21 has foil sections 23 and 24 which are formed in a single layer and arranged alternately in an array. Each of the foil sections has a structure such that when subjected to the non-mechanical means, a gradient in expansion develops within each first and second foil section in a direction transverse to the foil. This gradient causes a foil section to bend (unbend).

For example, in FIG. 3, the first foil sections 23 expand in the upper region (as indicated by the double-headed arrow with arrow heads pointing outwards) and contract in the lower regions (as indicated by the double-headed arrow with arrow heads pointing inwards). With respect to the second foil sections 24 the situation is reversed. Thus when the foil 21 is, in the flattened state, subjected to non-mechanical means, the foil section 23 and 24 bend in opposite directions in alternating manner causing the foil 21 to wrinkle and contract in the direction 2. As a result, end sections of the foil 21 located on opposite sides of the foil in the direction 2 are displaced linearly relative to another. Upon removal or application of a different non-mechanical stimulus the foil returns to its flattened, expanded, state. In practice due to imperfections in the foil it will be difficult to achieve a perfect regular wrinkling; to some extent imperfect wrinkling will have to be tolerated leading to a foil of which the displacement is not perfectly linear.

The bending and unbending in a single layer may be brought about by using foil sections formed of a material of which the composition changes in a direction transverse to the foil, the change in composition causing a gradient in expansion. Alternatively or in addition, a gradient in expansion may be brought about by gradient in the degree to which the non-mechanical means are experienced transverse to the layer. For example, if a layer includes a light-absorbing dye and is illuminated such that a gradient of light intensity is set up a gradient in temperature is created because the light energy absorbed is converted into heat, the amount of heat being proportional to the light intensity. The temperature gradient transverse to the layer so created results in a gradient of expansion and a bending of the foil section. An example is the bending induced in an azo-benzene liquid crystal gel by light exposure as disclosed by Ikeda et al in Adv. Mat. 2003, 15 no 3, pages 201 to 205. Using the composition of Ikeda, an alternating array of first and second foil sections can for example be manufactured by irradiating the foil pattern-wise in on both sides in an alternating manner. To this end, the foil can on both sides be provided with appropriately patterned light-reflective foils to allow a blanket exposure on both sides.

Because the linear motion is brought about by wrinkling and un-wrinkling the linear movement can be of quite large magnitude. In principle, there is no limit on the magnitude of linear movement which can be achieved. The magnitude can be increased by simply increasing the number of foil sections and/or the size of individual foil sections.

The foil in accordance with the invention can have any desired shape such as round and rectangular, triangular or more complex shapes. In order to improve control over the direction of contraction, the dimension in the direction of movement is preferably significantly larger, such as about 2 times, 5 times or even 10 times or more, than the dimension in directions orthogonal thereto thus obtaining a strip or beam form.

The thickness of the foil is not critical, be it that the magnitude of movement generally increases when the foil becomes thinner. For many applications, a thickness of about 2 mm or less is suitable, others may benefit form a thickness less than about 1 mm, or less than about 500 μm. In for example micro-mechanical application the thickness may be even less, for example, in a range of about 0.1 μm to about 100 μm.

Some applications may benefit use of a foil which does not have a constant thickness such as a wedge shape. The width and length of the foil is not critical and is basically determined by the application. Width and length may be anything from in a range from about 1 μm to about 1 m. Micro-mechanically active foils typically have lateral dimensions of about 1 to about 1000 μm.

The movement of the foil is brought about by non-mechanical means which work directly on the foil. Electric fields and magnetic fields may be used as non-mechanical means. Differential in-diffusion of a liquid may also be used as a means to bring about bending or unbending. Propensity for differential in-diffusion can be achieved by having a layer of a material of which the composition changes from apolar to polar when traversing the layer transversely from one major surface to another. When submersed in a liquid which has a specified polarity one major surface will take up more liquid than the other resulting in a difference in swelling which in turn results in bending.

Non-mechanical means further includes means to bring about a difference in temperature. When applying temperature differences as non-mechanical means differences in thermal expansion of materials of which the first and second foil section are composed are exploited to bring about bending and unbending. Differences in temperature can be brought about by extracting or supplying heat to the foil. Heat can be transferred to the foil (sections) by convection, diffusion, and/or radiation using means conventional as such and may be applied locally to one or more foils sections or to the entire foil. When the heat means are removed the foils sections automatically return to the shape before heating was applied. Depending on the construction of the foil sections heating may result in transition from a flattened to a bent state or a bent state to a flattened state. Heat may be provided or extracted by any conventional means of heating such as cooling means, infrared lamps or electrically by resistive heating.

In another embodiment, the foil sections are moveable non-mechanically by means of radiation. Means of radiation include actinic radiation such as gamma X-ray or e-beam radiation or in particular electromagnetic radiation such as light more in particular UV or visible light. The radiation may be used to generate heat so as to create an increase in temperature or a gradient in temperature. Radiation may be applied locally to one or more selected foil section or to the foil as a whole. Radiation may also directly bring about a difference in shape. See e.g. Ikeda et al, cited supra. A further embodiment of light-induced bending is disclosed in a patent application filed by Applicant on the same day entitled "Flexible foil moveable by means of light".

The layer or layers of the foil sections may be formed of any material which allows the foil section to bend or unbend (reversibly) by non-mechanical means. The particular choice of material is determined inter alia by the type of non-mechanical means used to (un)bend the foil sections. Materials which do not fail when bent repeatedly are generally suitable such as resilient materials like metals, synthetic resins, polymers and in particular rubbers and flexible materials may be also be used.

Polymeric materials are preferred. Polymeric materials have excellent resilient properties allowing movement of large magnitude and allowing, compared to inorganic foils, facile and cost-effective manufacture not only if the foil is of large area (for example surface area in the order of about 0.01 to 1 m$^2$ or larger) but also if the foil has a small area, where small means about 1 to about 1000 μm. The polymer may be linear or a (slightly) crosslinked polymer. The term "polymer" encompasses but is not limited to oligomer, homopolymer, copolymer, terpolymer and higher homologues, linear polymers, side chain and main chain, polymer blends.

Suitable polymers may have an elastic modulus which is high, e.g. about 1 GPa or more, or low, e.g. about 10 MPa or less, in the art referred to as an elastomer or more particular a liquid-crystalline elastomer if the elastomer is liquid-crystalline. For many applications the a modulus of about 5 MPa to about 2 GPa is suitable.

Anisotropically oriented polymers are particularly useful in the context of the present invention because they have directionally dependent properties. Anisotropically oriented polymeric materials are known in the art as such and include uniaxially or biaxially stretched polymeric material Polymerized liquid crystals are of particular use in the context of the invention. Polymerized liquid crystals facilitate a large degree of anisotropic orientation. If subjected to non-mechanical means above $T_g$ contraction in a lateral dimension of a foil section may be realized enabling a large magnitude (un)bending movement. Such materials are known in the art as such and include liquid crystal polymers and polymers obtained by polymerizing polymerizable liquid crystals in the oriented state.

Polymerizable liquid crystals may be photo-polymerizable and/or crosslinkable. Preferred polymerizable liquid crystals are (meth)acrylates, thiolenes, vinylethers, oxetanes and epoxides. Polymerizable liquid crystals allow the first and second foils sections to be formed simultaneously in-situ. A method of forming an oriented polymerized liquid crystal comprises providing a layer of polymerizable liquid crystal with the desired orientation on a substrate or sandwiched between two substrates, and polymerizing the liquid crystals in the desired oriented state to obtain a polymerized liquid crystal oriented in the desired state.

Anisotropically oriented polymerized liquid crystals may be suitably used in the multi-layered foil section such as the bi-layer arrangement shown in FIG. 1. For example, a planar oriented polymerized liquid crystal layer may be combined with a layer of randomly oriented polymer or polymerized liquid crystal. In the direction of planar orientation there is little expansion, or even contraction when brought to a temperature above $T_g$, when subject to non-mechanical means such as heat, whereas in directions orthogonal thereto expansion is relatively large and comparable to the expansion in the randomly oriented polymer layer. A similar effect is obtained when a discotic mesogenic groups are used. In another embodiment, a layer with a planar nematic order is combined with a layer having a homeotropic nematic order.

Polymerized liquid crystal can also be used to provide single-layer foil sections. In particular a foil wherein at least one of the first and second foil sections includes a polymerized liquid crystal which, near one major surface of the foil, is anisotropically oriented and exhibits, in directions transverse to the foil, a change in orientation and/or concentration. A change in orientation may be a change in the degree of orientation or a change in the average direction of orientation.

In order to obtain a foil section which bends when non-mechanically addressed, the change in orientation and/or concentration is typically asymmetric where asymmetry can be conveniently expressed with respect to a lateral middle plane of a foil section.

A gradual change in concentration is achieved by blending the polymerized liquid crystal with a second material, such as polymer, and then have a concentration gradient of the two transverse to the foil section.

When using a change in the degree of orientation, a change from anisotropically oriented near one major surface to isotropically oriented near the opposite may take place in transverse direction. For example, in one embodiment the orientation may gradually change from a planar or homeotropic orientation at one major surface to an isotropic orientation at the major surface opposite thereof. This may be achieved using polymerized liquid crystals comprising calamitic or discotic mesogenic groups.

A twisted nematic order is an embodiment of a gradual change in the direction of orientation. When using a twisted nematic order, it is advantageous to use a foil which is long in the direction 2 and small in width because a twisted nematic order is inclined to bend with equal magnitude along two mutually orthogonal directions.

Figure 4:
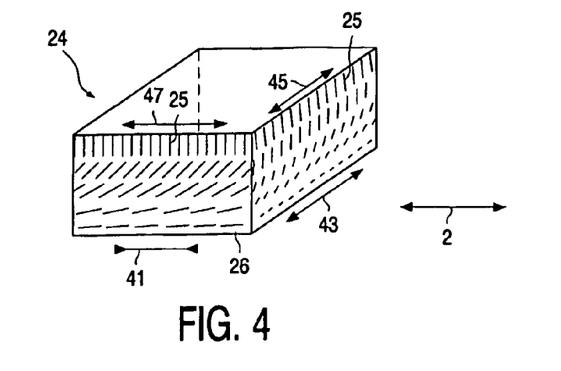
FIG. 4 shows, schematically, a perspective view of a foil section having a splay orientation.

An attractive embodiment is shown in FIG. 4. FIG. 4 shows, schematically, a perspective view of a foil section having a splay orientation.

The foil section 24 has a nematic splay orientation. In the region 26 adjacent the bottom major surface the orientation is planar, going towards the region 25 the direction of orientation gradually changes to end with a homeotropic orientation near the upper major surface in the region 25. When the region 26 is subjected to non-mechanical means which decrease the orientation of the polymerized liquid crystal in that region, a small amount of expansion or contraction occurs in the lateral direction 2 as indicated by the inward pointing double headed arrow 41. In lateral directions orthogonal thereto more expansion occurs as indicated by the outward pointing double headed arrow 43.

In the region 25, the reduction of orientation brought about by the non-mechanical means leads to a relative large expansion in the direction 2 (indicated by arrow 47) and in the lateral direction orthogonal thereto indicated by the double headed arrow 45. The net effect of the non-mechanical means on the foil section is a bending in one direction only. A similar effect can be achieved using a discotic splay orientation and a splay chiral nematic orientation.

The anisotropic orientation of the polymerized or polymerizable liquid crystals can be achieved by conventional means such as electric and magnetic fields, orientation layers, such as rubbed polyimide or obliquely deposited silicon dioxide, or by applying shear forces. A homeotropic alignment may be achieved spontaneously by proper selection of the polymerizable liquid crystal mixture and exposure of a layer thereof to an air interface. Surfactants may also used to induce homeotropic alignment. A pattern-wise orientation, required when first and second foil sections are to be formed simultaneously, is conveniently obtained using the well known of photoalignment or by using locally applied electric and/or magnetic fields.

The foil sections may be moved between the flattened and the bent state in a variety of ways.

In a first embodiment, applying the non-mechanical means results in a transition from the flattened to the bent state. In this embodiment the foil sections are in the flattened state when no mechanical means are applied; in a second embodiment, pre-bent foils sections are used which flatten when the non-mechanical means are applied.

The foil sections and thus the foil may be mono-stable or bi-stable with respect to application of the non-mechanical means. In the mono-stable variant only one of the states, the bent state or the flattened state, is a stable state, where stable means not changing shape when no non-mechanical means are applied. The other is a stabilized state that is a state which is stable only as long as the non-mechanical means are applied. An example of such a mono-stable foil is a foil where the non-mechanical means are means to provide difference in temperature. Only as long as the temperature is different from the ambient, the bent state (or flattened state depending on the structure of the foil) is maintained. If the temperature is allowed to return to ambient by switching off the cooling or heating means the foil reverts back to the stable state. A bi-stable foil has two stable states. An example of a bi-stable foil is the foil disclosed by Ikeda et al.

The foil in accordance with the invention is typically not used in isolation but is part of a certain structure.

The foil may be attached to the structure via an interior portion of the foil allowing a (concerted) movement on both sides of the point of attachment. Alternatively, an end portion of the foil may be attached to the structure thus maximizing the magnitude of foil movement. Any combination thereof is also possible. If needed in addition the structure may provide guiding and/or supporting members which guide and/or support the foil or its movement. When attached to a surface, the foil may make any angle with such surface; it may be attached perpendicular or substantially parallel to the surface optionally via a raised support.

The foil in accordance with the invention has many applications. It may be used as an actuator, that as a device for displacing objects or setting other objects in motion. The movement may be converted into electric energy by attaching a metal object to the foil and move the metal object in and out a coil. The induction in the coil sets up an electrical current. The foil may also be used to exert force. Specifically, if the foil exerts force against a piezoelectric material a voltage results.

In another embodiment, the foil functions as a valve which is reversibly moveable (switchable) by non-mechanical means between an open and a closed state. Such a valve, which in a broad sense may be regarded as a moveable barrier separating selected spatial regions, has many interesting uses. In a first use, the valve is a shutter or closing means for shutting out or closing in or keep spatially separate matter or radiation such as light. The shutter may be used to shield a structure from ambient matter or radiation. Alternatively, the valve may be used as a means to prevent matter or radiation from escaping into the ambient. In particular the valve may form the closing means of a container. Such a container may for example contain a therapeutically active compound which compound can then, by non-mechanical means, be released in a controlled manner. Also, the valve can be used for controlling transmission or reflection of light. In the latter case, the valve obscures or exposes a light-reflective surface arranged below. The foil may be attached to a substrate standing upright or lying down. If lying down, it is convenient to attached the foil to a raised support.

In many applications it is desirable to have a plurality of foils in accordance with the invention arranged on a single substrate in accordance with a desired pattern. If each such foil is non-mechanically moveable individually, applications such as displays can be realized.

EXAMPLE

Figure 5:
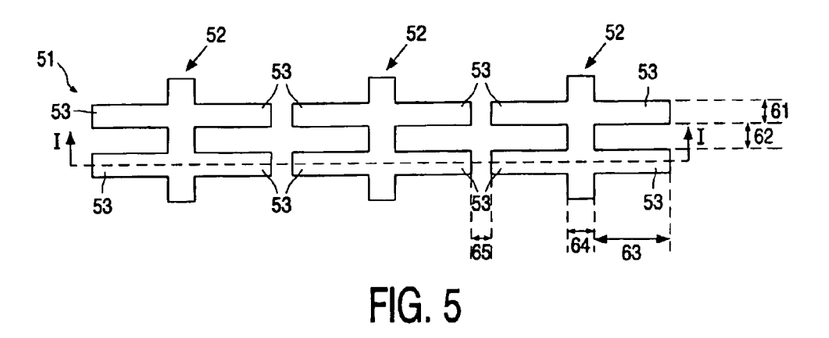
FIG. 5 shows, schematically, a top view of an array of foils in accordance with the invention.
Figure 6:
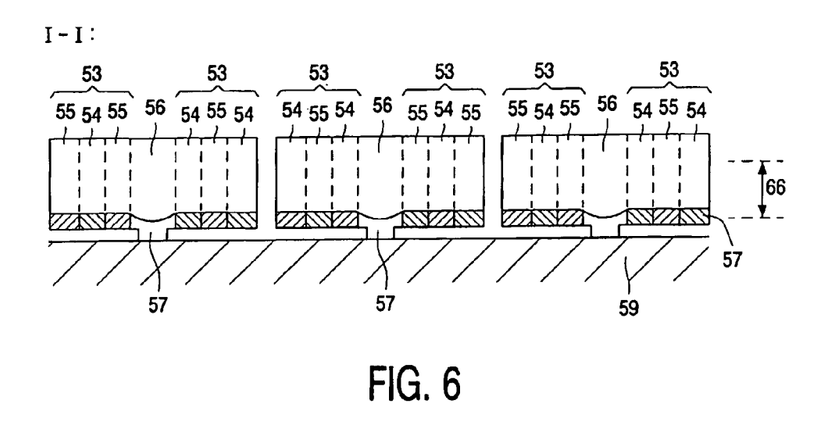
FIG. 6 shows, schematically, a cross-sectional view of the array of FIG. 5 along the line I-I.

FIG. 5 shows, schematically, a top view of an array of foils in accordance with the invention; and FIG. 6 shows, schematically, a cross-sectional view of the array of FIG. 5 along the line I-I.

FIG. 5 shows an array 51 of three flexible foils 52. Each flexible foil 52 has the shape of a double cross. On each free end of a cross-member of a double-cross a moveable section 53 is arranged. Each moveable section 53 includes an alternating array of first and second foil sections, denoted 54 and 55 respectively. The first and second foil sections are each (reversibly) non-mechanically moveable between a flattened and a bent state. More particular, when subjected to non-mechanical means, the first foil sections 54 bend away from the substrate 59 and the second foil sections 55 bend towards it.

The flexible foils 52 each comprise a polymerized liquid crystal layer 56 and a patterned orientation layer 57. The patterned orientation layer 57 is during manufacture used to orient the polymerizable material from which the polymerized liquid crystal is obtained, as further detailed below.

In the present example, the width 61 of a moveable section 53 is 100 μm, whereas the length 63 is about 800 μm. The first and second foil sections are each 50 μm wide, thus each moveable section 53 has 16 foil sections. The width 64 is 100 μm. In an embodiment, 62 denotes the space between the horizontal sections of the double cross configuration of a flexible foil 52.

The spacing 65 between the foils 52 is 20 μm and the thickness 66 of the flexible foils 52 about 10 μm.

Figure 7:
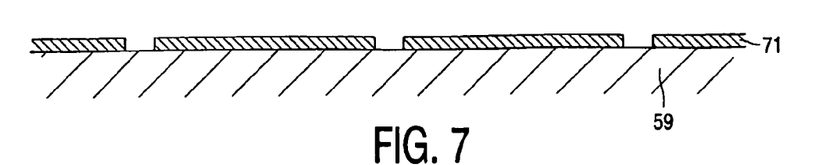
FIG. 7 shows, schematically, in a cross-sectional view, a first stage of a method of manufacturing the array shown in FIGS. 5 and 6.

The array 51 of foils 52 can be manufactured as follows:

Referring to FIG. 7, a glass substrate 59 is coated with a 100 nm thin film of copper. A positive photo-resist pattern is defined on the copper layer. The parts of the Cu layer not covered by the photo-resist are etched away using cerium ammonium nitrate solution (200 g cerium ammonium nitrate, 35 ml acetic acid and 1000 ml de-ionized water) resulting in a substrate covered with a patterned sacrificial copper layer 71 as shown in FIG. 7.

The copper plated glass substrate 71, 59 is then coated with an orientation layer 57 having planar alignment sections 57a capable of orienting nematogens in a planar orientation and homeotropic alignment sections 57b capable of orienting nematogens homeotropically. The sections 57a and 57b are laid out in an alternating arrays extending in the longitudinal direction of respective moveable sections 53.

Orientation layers, such as the orientation layer 57 and methods of manufacturing such layers are known in the art as such, see e.g.

Patterned alignment of liquid crystals on selectively thiol-functionalized photo-orientation layers, Wilderbeek, Hans T. A; Teunissen, Jean-Pierre; Bastiaansen, Cees W. M.; Broer, Dirk J., Advanced Materials (Weinheim, Germany) (2003), 15 (12), 985-988.

The orientation layer 57 is manufactured by:
providing a layer of photo-alignable material having (unreacted) ene groups (an ene group is a chemical group having an unsaturated double bond), exposing the areas corresponding to the areas 57a patternwise with polarized UV light so as to make the ene groups the of photo-alignable material react with one another in the exposed areas thus providing the exposed areas 57a with the capability of orienting liquid crystals planar, exposing, while supplying an effective amount of heat, the non-irradiated areas which have unreacted ene groups to octadecylthiol in the presence of a thermal free radical initiator, the octadecylthiol reacting with the ene groups to form areas 57b capable of orienting liquid crystals homeotropically.

The illumination with polarized UV light proceeds through a striped mask having a periodic 50 μm/50 μm lines/space pattern. In the sections 57c the photo-alignable material is fully exposed to UV light so as to remove all ene groups thus rendering the section 57c substantially unreactive towards the octyidecylthiol. The formation of octyidecylthiol in the areas 57c is to be prevented because at those locations the foil is to adhere to the substrate 59 and the presence of octyidecylthiol adversely affects such adhesion.

The orientation layer 57 thus formed is about 100 nm thick.

Figure 8:
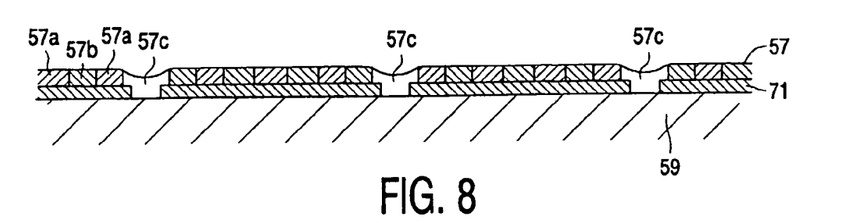
FIG. 8 shows, schematically, in a cross-sectional view, a second stage of a method of manufacturing the array shown in FIGS. 5 and 6.

The stage shown in FIG. 8 is now obtained.

Figure 9:
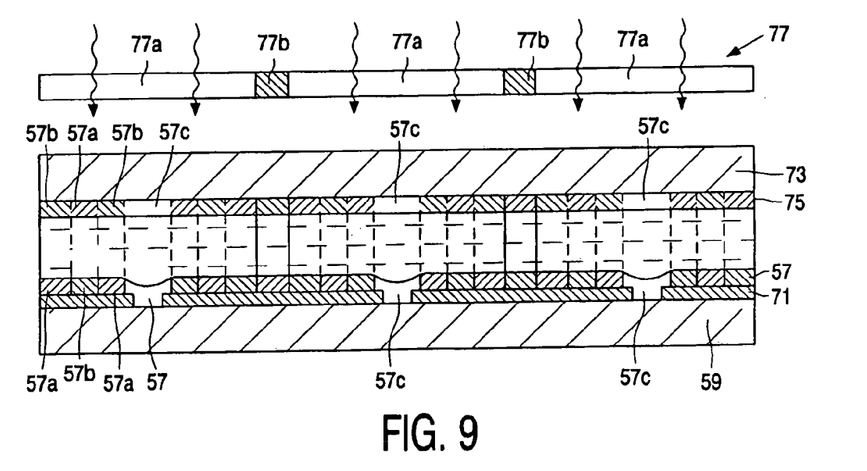
FIG. 9 shows, schematically, in a cross-sectional view, a third stage of a method of manufacturing the array shown in FIGS. 5 and 6.

Referring to FIG. 9, using a method similar to that used for providing the orientation layer 57, a glass plate 73 is provided with a patterned orientation layer 75 having planar alignment sections 57a, homeotropic alignment sections 57b and sections 75c functionalized with octadecylthiol to prepare the glass plate 73 for easy release at a subsequent stage of manufacture.

The sections 57a, 57b, and 75c on the glass plate 73 are laid out such that when properly mated and aligned with the glass plate 59, the planar alignment sections 57a align with the homeotropic alignment section 57b on the glass plate 59, the homeotropic sections 57b align with the planar alignment sections 57a on the glass plate 59 and the sections 75c align with the sections 57c.

The glass plates 59 and 73 are then mated, aligned, and spaced using 10 μm diameter glass spheres (not shown). As shown in FIG. 9, planar alignment sections 57a on glass plate 59 are located opposite homeotropic sections 57b on glass plate 73 and homeotropic sections 57b on glass plate 59 are located opposite planar alignment sections 57a on glass plate 73.

A nematogenic photo-polymerizable liquid crystal comprising the following components:

LC monomer 4

LC monomer 5

2-Benzyl 2-dimethylamino 1-(4-morpholinophenyl) butanone-1 (BDMMB).

p-methoxy phenol is prepared in the weight ratios:

| | |
|---|---|
| LC monomer 1 | 28 parts/wt |
| LC monomer 2 | 20 parts/wt |
| LC monomer 3 | 10 parts/wt |
| LC monomer 4 (trans) | 15 parts/wt |
| LC monomer 5 | 25 parts/wt |
| BDMMB | 2 parts/wt |
| p-methoxy phenol | 200 ppm | by mixing and dissolving the components in dichloromethane and then evaporating the dichloromethane in a vacuum oven.

The LC monomers 1, 2 and 3 are photo-polymerizable nematogenic acrylates. The LC monomer 4 is, apart from being a photo-polymerizable acrylate, a photo-isomerizable azo-benzene dye which can exist in a trans and cis isomer. By subjecting the LC monomer 4 to light of the appropriate wavelength the trans isomer is converted into the cis isomer. The cis and trans isomer molecules have different shapes. BDMMB is a photo-initiator and p-methoxy phenol an inhibitor used for preventing polymerization at unwanted stages of the manufacture.

A melt of the photo-polymerizable liquid crystal material (using the trans isomer of LC monomer 4) is introduced by capillary action at 100° C. between the glass plates 59 and 73 forming a layer of polymerizable liquid crystal. After filling, the photo-polymerizable liquid crystal material is rapidly brought to 120° C., kept at this temperature for 5 minutes and then slowly cooled down to 40° C. This annealing is very important to establish the desired splay orientation.

Due to the presence of the orientation layers 57 and 75, when cooled down to 40° C., the liquid crystal material becomes anisotropically oriented. More in particular, first regions of anisotropically oriented polymerizable liquid crystal material are formed between respective regions 57a on the glass plate 59 and respective regions 57b on the glass plate 73, whereas second regions of anisotropically oriented polymerizable liquid crystal material are formed between respective regions 57b on the glass plate 59 and respective regions 57a on the glass plate 73. In each of the first and second regions the liquid crystal material is splay oriented. In the first regions, near the glass plate 59, the orientation is planar and near the glass plate 73 homeotropic. In the second regions, near the glass plate 59, the orientation is homeotropic and near the glass plate 73 planar. The first and second regions form alternating arrays of splay oriented polymerizable liquid crystal.

Still referring to FIG. 9, the polymerizable liquid crystal layer thus oriented is exposed to UV light through a mask 77 having transparent regions 77a and opaque regions 77b. The layout of the transparent regions 77a corresponds to the top view of the foil shown in FIG. 5. Preferably, polarized UV light with its electrical field vector perpendicular to the orientation direction of the planar aligned monomers is used. In this way it is prevented as much as possible that the azo group containing monomers already undergo their transition from trans to cis, thus disturbing the molecular alignment. The exposure dose is 30 minutes at an intensity of 5 mW.cm$^{-2}$. This dose is somewhat larger than normally used because of absorption of the azo compounds in the wavelength regions of interest of the photoinitiator.

Figure 10:
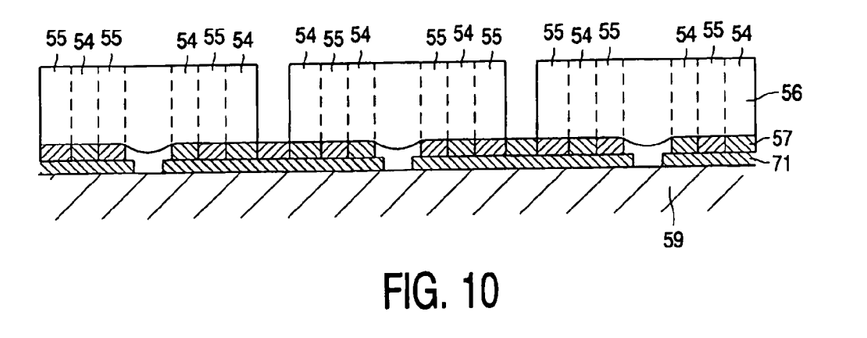
FIG. 10 shows, schematically, in a cross-sectional view, a fourth stage of a method of manufacturing the array shown in FIGS. 5 and 6

Referring to FIG. 10, after exposure to UV light, the polymerized liquid crystal is formed. Since during polymerization the orientation remains substantially the same the splay orientation is maintained in the polymerized liquid crystal layer 56 resulting in alternating arrays of splay oriented first foil sections 54 and second foil sections 55. The areas of the polymerizable liquid crystal layer which are shadowed by the mask 77 are not polymerized.

After exposure with UV light, the glass plate 73 and orientation layer 75 are removed from the polymerized liquid crystal layer 56. Because the regions 75c are functionalized with octadecylthiol release of this glass plate is easy relative to the glass plate 59.

The polymerizable liquid crystal material still present in the areas shadowed by the mask 77 is then washed away using xylene.

The stage shown in FIG. 10 is now reached.

Finally, the sacrificial copper layer 71 is removed in a bath of cerium ammonium nitrate of the same composition as given above, resulting in the structure shown in FIG. 6.

In the event, a foil section 53 adheres firmly to the substrate due to capillary forces, it is beneficial to dry the array of foils 51 (further) using supercritical carbon dioxide in order to release such foil sections.

The array of flexible foils 51 thus manufactured is subjected to UV light with a wavelength of 365 nm and an intensity of 3.5 mW.cm$^2$.

In response to the UV exposure, the moveable foil sections 53 immediately start to wrinkle. A light transmission experiment shows that, within 5 seconds, 50% of the substrate surface area initially covered by the moveable foil sections 53 is exposed.

As a result of the wrinkling, the foil in accordance with the invention reaches a height of about 25 μm or even less, which demonstrates that the movement of foil is substantially linear. After all, by comparison, a flexible foil which has 800 μm long moveable sections 53 and which has along its entire length a homogeneous splay orientation as opposed to an alternating array, and which thus curls when irradiated with UV light reaches a height of about 500 μm.

When the UV light source is switched off, the foil sections 53 very slowly un-wrinkle, a process which can be accelerated by heating and then cooling. Un-wrinkling is very effectively realized by exposure of the foil to light of 500 nm or higher, as provided for example by a Xenon lamp fitted with a cut-off filter of 500 nm. After about 2 minutes, the foil reaches its flattened state.

The invention claimed is:

1. A flexible foil, moveable by non-mechanical means, comprising an alternating array of first and second foil sections each non-mechanically moveable between a flattened state and a bent state having a predetermined direction of bending, wherein the predetermined direction of bending of first foil sections is opposite to the predetermined direction of bending of second foil sections.

2. A foil as claimed in claim 1 wherein at least one of the first and second foil sections includes a polymeric material.

3. A foil as claimed in claim 2 wherein the polymeric material includes an polymerized liquid crystal.

4. A foil as claimed in claim 3 wherein at least one of the first and second foil sections includes a polymerized liquid crystal which, near one major surface of the foil, is anisotropically oriented and exhibits, in directions transverse to the foil, a change in orientation and/or concentration.

5. A foil as claimed in claim 4, wherein the polymerized liquid crystal has a splay orientation with a planar orientation near the one major surface of the foil and a homeotropic orientation near the major surface opposite the one major surface.

6. A foil as claimed in claim 1 wherein at least one of the first and second foil sections is non-mechanically moveable between a flattened state and a bent state by means of radiation.

7. A foil as claimed in claim 1 wherein at least one of the first and second foil sections are non-mechanically moveable between a flattened state and a bent state by means of supplying or extracting heat or combination thereof.

8. A foil as claimed in claim 1 wherein the foil is attached to a structure which is fixed relative to the movement of the foil.

9. A foil as claimed in claim 8, wherein the foil is a valve switchable between a closed and an open state.

\* \* \* \* \*